(12) United States Patent
Langut et al.

(10) Patent No.: US 11,282,765 B2
(45) Date of Patent: Mar. 22, 2022

(54) STIFFENER RING

(71) Applicant: Mellanox Technologies, Ltd., Yokneam (IL)

(72) Inventors: Ilan Langut, Yuvalim (IL); Beeri Halachmi, Kfar Saba (IL)

(73) Assignee: Mellanox Technologies, Ltd., Yokneam (IL)

( * ) Notice: Subject to any disclaimer, the term of this patent is extended or adjusted under 35 U.S.C. 154(b) by 58 days.

(21) Appl. No.: 16/815,546

(22) Filed: Mar. 11, 2020

(65) Prior Publication Data
US 2021/0287958 A1 Sep. 16, 2021

(51) Int. Cl.
*H01L 23/00* (2006.01)
*H01L 23/367* (2006.01)

(52) U.S. Cl.
CPC ........ *H01L 23/3675* (2013.01); *H01L 23/562* (2013.01)

(58) Field of Classification Search
CPC ............................................ H01L 2224/49171
See application file for complete search history.

(56) References Cited

U.S. PATENT DOCUMENTS

| 4,370,688 | A  | * | 1/1983  | Richardson | G11B 23/0335 |
|           |    |   |         |            | 360/133      |
| 7,161,239 | B2 | * | 1/2007  | Zhao       | H01L 23/3128 |
|           |    |   |         |            | 257/707      |
| 7,462,933 | B2 | * | 12/2008 | Zhao       | H01L 23/3128 |
|           |    |   |         |            | 257/713      |
| 2003/0111726 | A1 | * | 6/2003  | Khan     | H01L 23/49838 |
|           |    |   |         |            | 257/730      |
| 2010/0086362 | A1 | * | 4/2010  | Aubault  | B63B 35/44   |
|           |    |   |         |            | 405/195.1    |
| 2019/0098743 | A1 | * | 3/2019  | Molla    | H01L 23/3736 |
| 2019/0172767 | A1 | * | 6/2019  | Kwon     | H01L 21/67121 |
| 2019/0278102 | A1 | * | 9/2019  | Suter    | G02B 27/646  |
| 2019/0327859 | A1 | * | 10/2019 | Iyengar  | H05K 7/20772 |
| 2020/0102736 | A1 | * | 4/2020  | Cosley   | A62C 2/065   |
| 2020/0273777 | A1 | * | 8/2020  | Jain     | H01L 21/565  |
| 2021/0035738 | A1 | * | 2/2021  | Goh      | H01L 28/60   |

* cited by examiner

*Primary Examiner* — Thao P Le
(74) *Attorney, Agent, or Firm* — Alston & Bird LLP

(57) ABSTRACT

A stiffener ring for an ASIC package has a non-uniform cross-section.

20 Claims, 7 Drawing Sheets

STIFFENER RING

FIELD OF THE INVENTION

The present invention relates to a stiffener ring for an ASIC package. More particularly, the invention relates to a stiffener ring configured to allow direct heat dissipation access to the backside of a silicon die located in close proximity to the edge of the ASIC package, be it a multi-chip module or a single die package.

BACKGROUND OF THE INVENTION

High power ASICs may be packaged using a stiffener ring which allows direct heat dissipation access to the back side of the silicon die by a heat sink. In order to improve mechanical support and reduce warpage of the ASIC package, the stiffener ring is sometimes designed to be higher than the silicon die. However, the art has so far failed to provide a higher-than-silicon stiffener ring that is suitable for use in ASIC packages in which the silicon die is close to the package edge, and as a result, prior art stiffener rings limits access of the heat sink to the back side of the silicon die. This problem is illustrated in FIGS. 1 (A and B), which is a conceptual illustration showing in FIG. 1A a cross-section of an ASIC package 10, taken along the AA plane of FIG. 1B, provided with a die 11 located in close proximity to a stiffener ring 12, which is higher than die 11. As the figure shows, heat sink 13 would occupy the same space as stiffener ring 12, in overlapping volume 14. Accordingly, heat sink 13 cannot, in a real situation, be brought into contact with die 11. A real situation is shown in FIG. 1C, using the same numerals as in FIGS. 1A and 1B. In FIG. 1A, the package base is indicated by numeral 15 and is omitted from other figures, for the sake of simplicity.

It would therefore be highly advantageous to be able to provide a stiffener ring that overcomes the abovementioned disadvantages of the prior art. It is therefore an object of the present invention to provide a higher-than-silicon stiffener ring, which is suitable for use in ASIC packages in which the silicon die is close to the package edge, and which allows access of the heat sink to the back side of the silicon die.

The above and other characteristics and advantages of the invention will be further made apparent by the following illustrative and non-limitative description of embodiments thereof, with reference to the appended drawings.

SUMMARY OF THE INVENTION

In one aspect, the invention relates to a stiffener ring for an ASIC package, having a non-uniform cross-section. In one embodiment of the invention the stiffener ring has a stepped cross-section. In another embodiment of the invention the stiffener ring comprises a first section having a height greater than that of a peripheral silicon die, and a second section having a height smaller than, or equal to that of said silicon die. In an embodiment of the invention the first section of the stiffener ring comprises a chamfered portion, which may be formed with an angle equal to, or different from 45°.

According to particular embodiments of the invention, the stiffener ring may have a cross-section of the first section, which has a straight or non-straight profile. Similarly, the cross-section of the second section of the stiffener ring may have a straight or a non-straight profile.

The invention also encompasses an ASIC package comprising a stiffener ring having a non-uniform cross-section.

DETAILED DESCRIPTION OF THE INVENTION

Figure 2A:
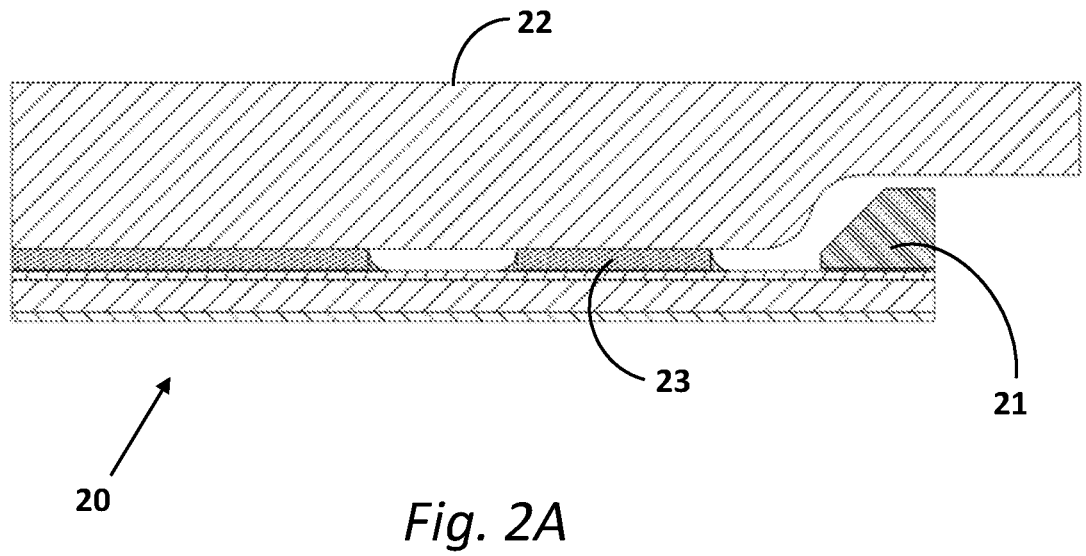
FIGS. 2 (A and B) schematically illustrates in cross section an ASIC package employing a narrow stiffener ring.
Figure 2B:
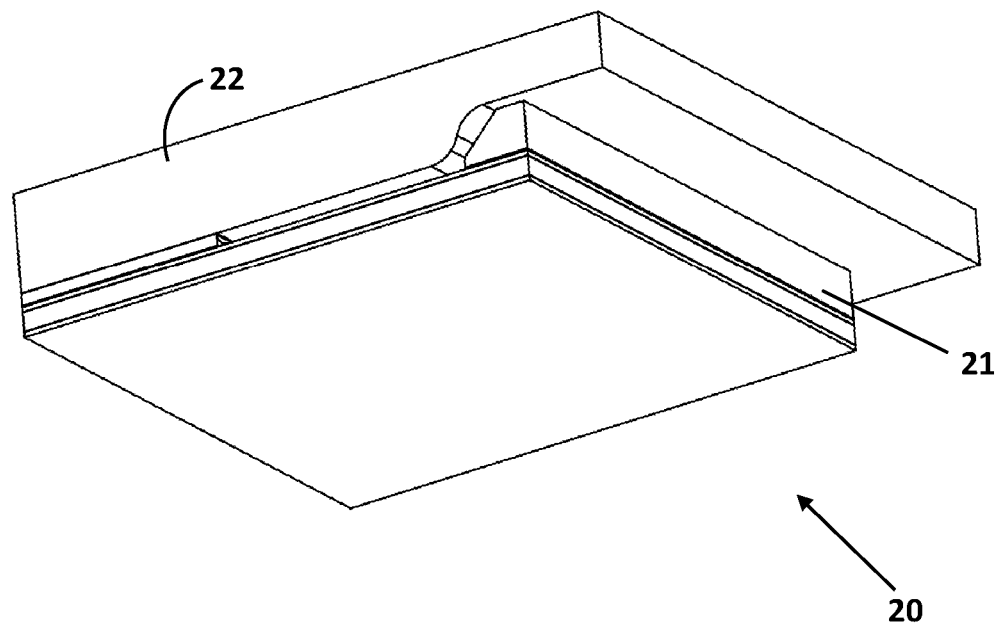

FIGS. 2 (A and B) show an ASIC package 20 employing a stiffener ring 21 having a narrow profile. Using a ring of this kind allows access by the heat sink 22 to the peripheral die 23. However, because of its narrow profile, the stiffener ring does not provide sufficient mechanical support and only allows for a narrow contact area therewith, thus resulting in a substantial package warpage.

Figure 3A:
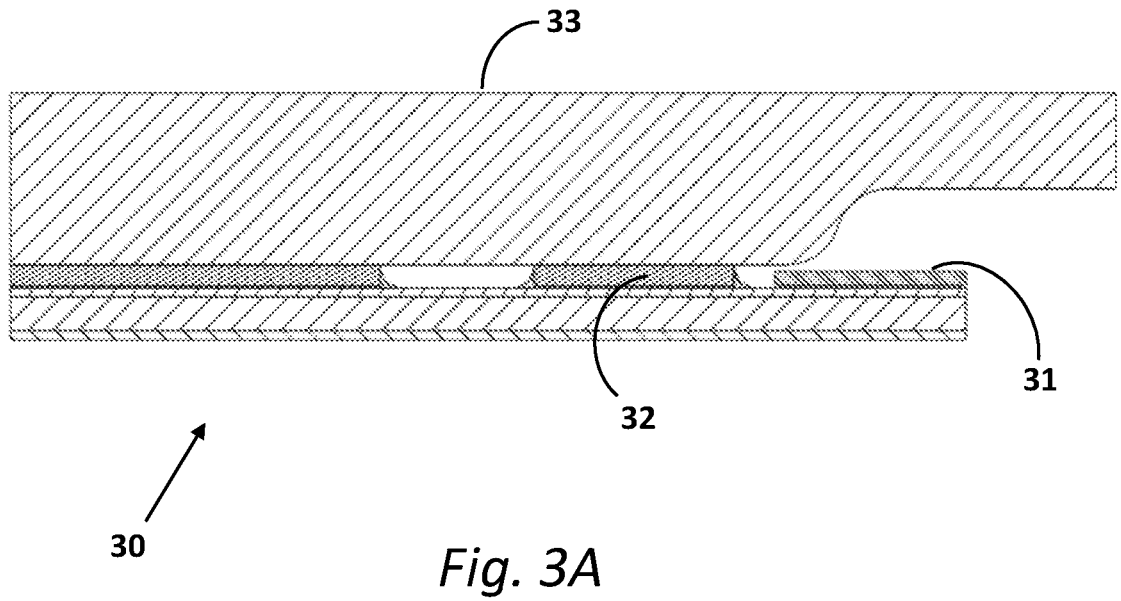
FIGS. 3 (A and B) schematically illustrates in cross section an ASIC package employing a stiffener ring of a height lower than that of a peripheral silicon die.
Figure 3B:
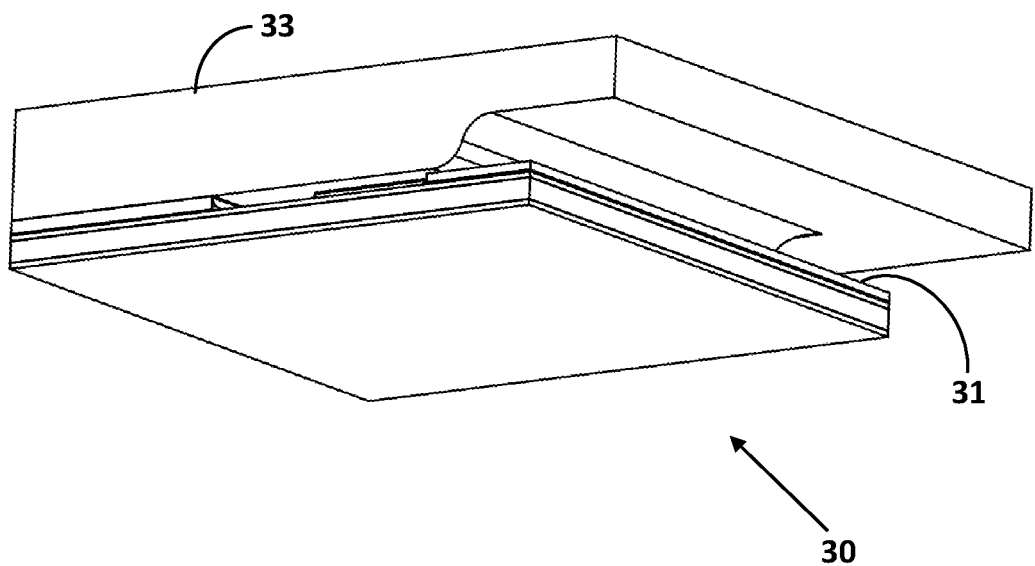

FIGS. 3 (A and B) shows an ASIC package 30 employing a stiffener ring 31 having a thickness smaller than that of the peripheral die 32. Using a stiffener ring of this kind allows access of the heat sink 33 to the peripheral die 32. However, reducing the ring height below that of the silicon die results in a ring with low mechanical strength, leading to increased ASIC package warpage.

Figure 4A:
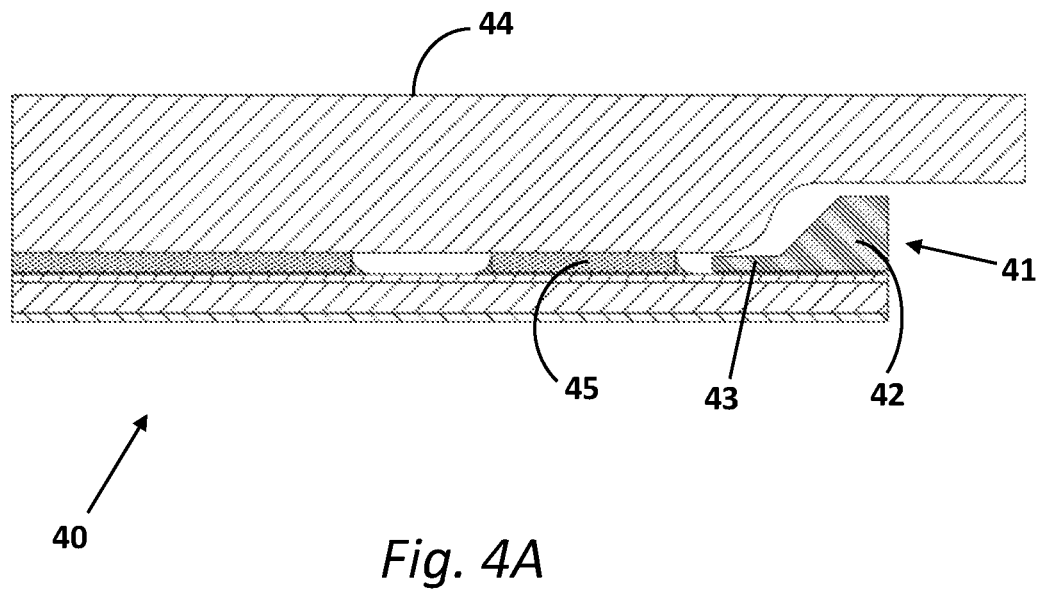
FIGS. 4 (A and B) schematically shows a cross section of an ASIC package employing a stiffener ring according to the invention.
Figure 4B:
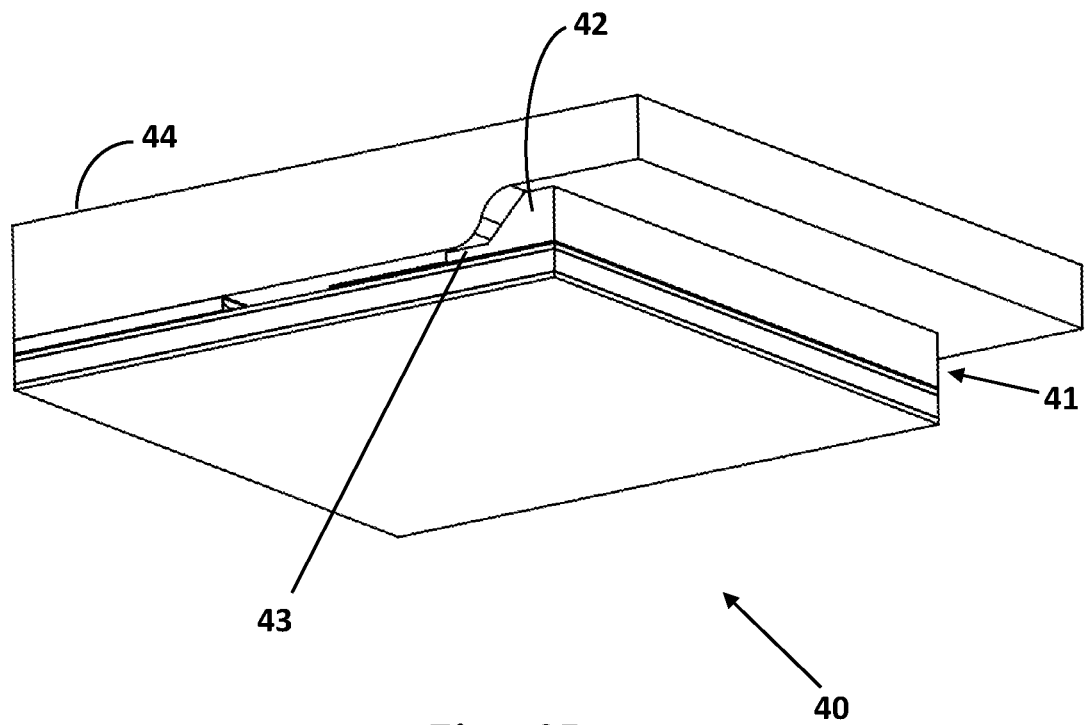

FIGS. 4 (A and B) illustrates the invention through one particular embodiment thereof. An ASIC package generally indicated at 40 is stiffened with a stiffener ring 41, having a stepped cross-section comprising a higher-than-die section 42 and a lower-than-die section 43. As is clearly understood from the figure, the stiffener ring of the invention achieves two significant results: it allows heat sink 44 access to the peripheral die 45, and at the same time, it provides a large contact area and improved stiffness as compared to stiffener rings of the prior art.

In the context of the present invention, the term "lower-than-die" should be given a broad interpretation, to include any height and shape of section 43, which prevent it from interfering with heat sink 44, such that heat sink 44 is able to be in direct contact with peripheral die 45. Accordingly, the cross-section of section 43 does not necessarily have to be straight, as shown in FIG. 4, but in other embodiments it can be of any other shape, e.g. concave or convex. Similarly, the chamfer of section 42 does not have to be at 45° and can be made with any other suitable angle and, as with the cross-section of section 43, it does not necessarily have to be straight, and can be of any other suitable shape, e.g. concave or convex.

Furthermore, in the context of the present invention the term "non-uniform cross-section" refers to a cross section that can be defined by joining different polygons, and not a cross-section that results from a gradual change in one dimension, as it happens, for instance, with a chamfered shape.

Figure 5:
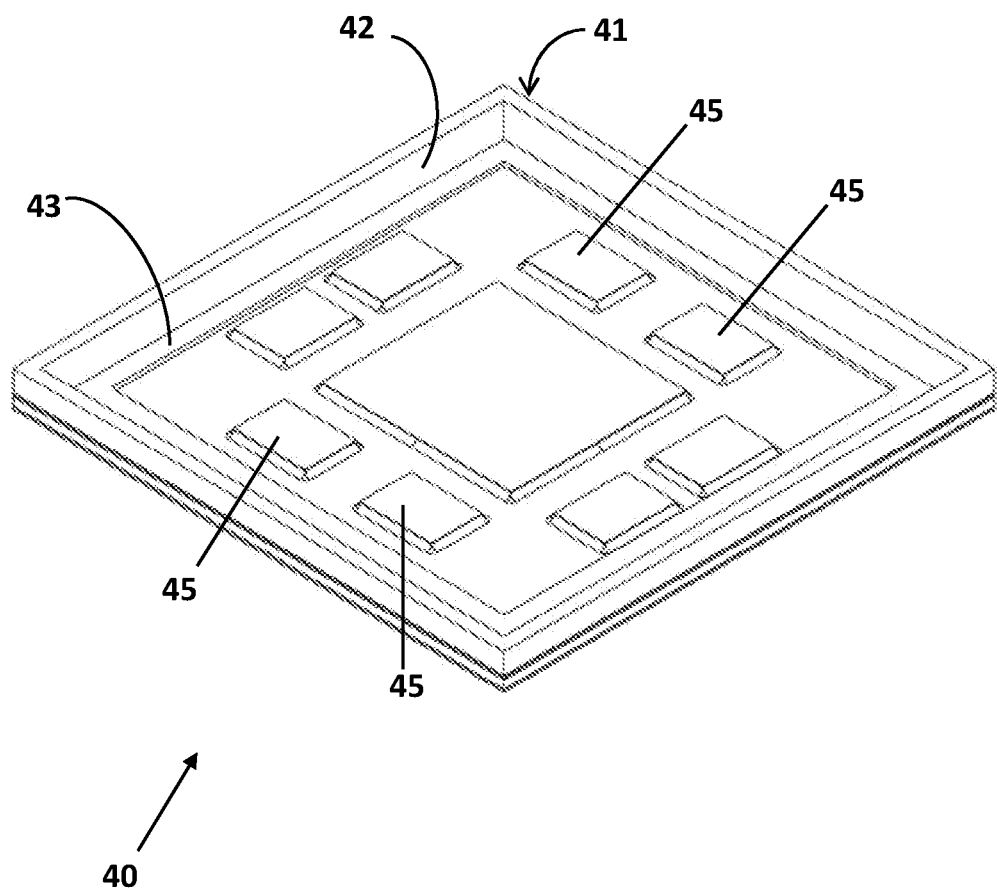
FIG. 5 is a schematic perspective view of an ASIC package employing a stiffener ring according to the invention, with the heat sink removed.

The above is further illustrated in FIG. 5, which shows an ASIC package with the heat sink removed. The same elements are indicated with the same numerals as in FIG. 4. This figure clearly illustrates the advantage of the invention and how it allows easy access to dies 45 for heat removal.

Figure 6:
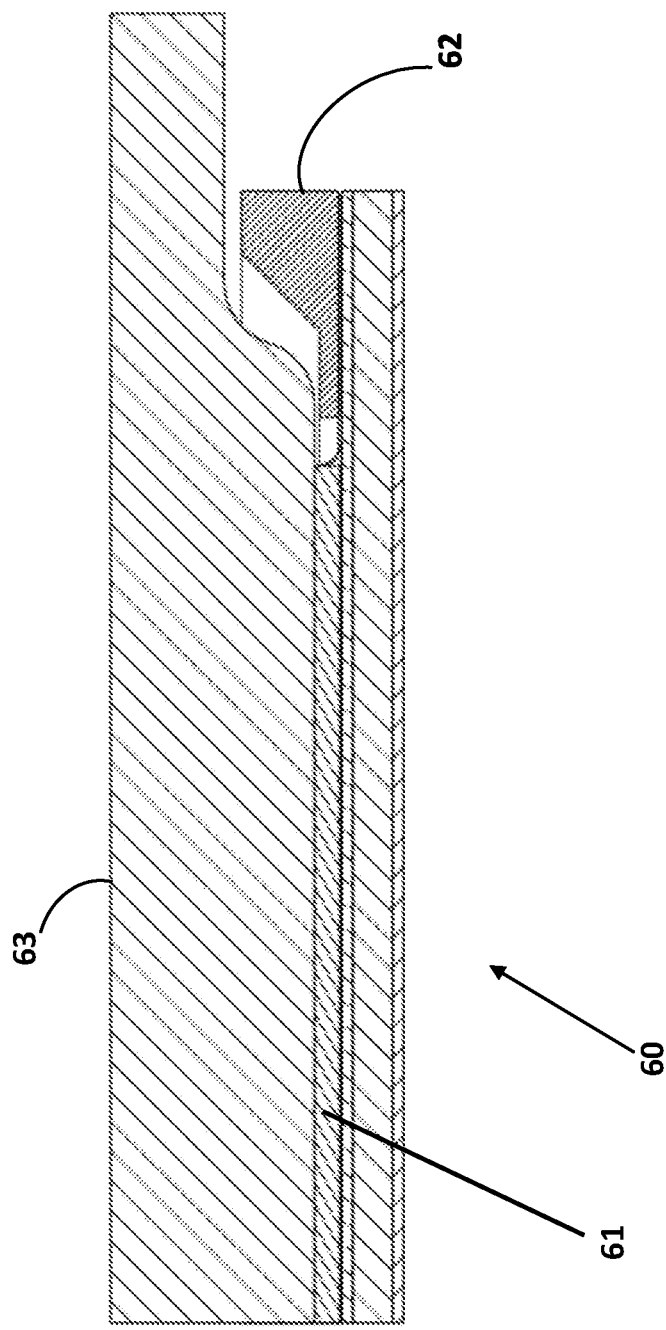
FIG. 6 schematically shows a cross section of a single die ASIC package employing a stiffener ring, according to another embodiment of the invention.

FIG. 6 shows a single die ASIC package 60, with a single die 61, employing a stiffener ring 62 having a thickness smaller than that of die 61. Using a stiffener ring of this kind allows access of the heat sink 63 to the die 61. As will be apparent to the skilled person, the invention is not limited to any particular die arrangement and is applicable to multi-chip modules and to single die packages alike.

Example

In order to further illustrate the advantages of the invention, FEA simulations of package warpage were carried out at 30° C. ANSYS (ANSYS, Inc.—Canonsburg, Pa.) finite element software was used to generate a 3D thermo-mechanical model used to study the effect of stiffener design on warpage of the assembled ASIC package following assembly. The simulations, which are standard in the art of warpage assessment, show that utilizing the stepped ring design provides significantly better warpage minimization compared to prior art solutions, as clearly shown in Table 1 below.

TABLE 1

Figure 1A:
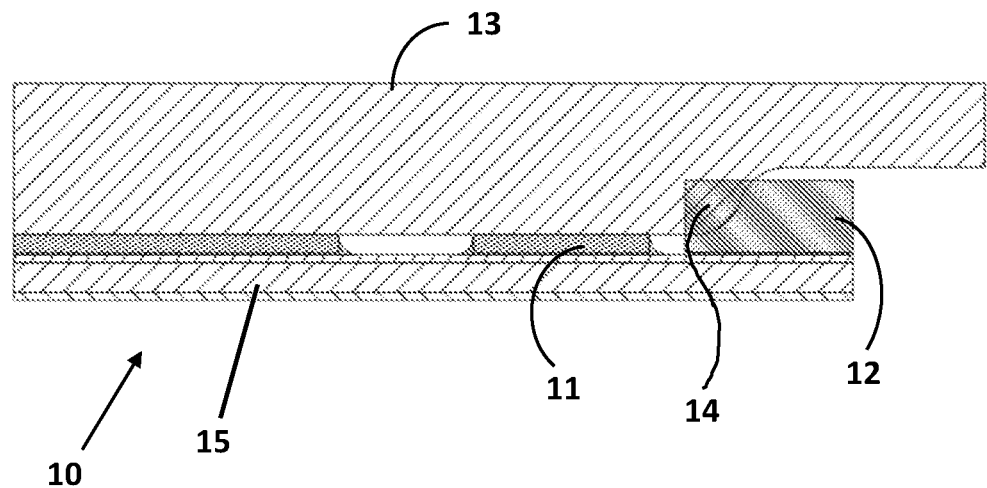
FIGS. 1 (A and B) is a conceptual illustration of the problem arising from the use of a stiffener ring that is higher than a peripheral die.
FIG. 1C shows the actual situation existing with the use of a stiffener ring that is higher than a peripheral die.
Figure 1B:
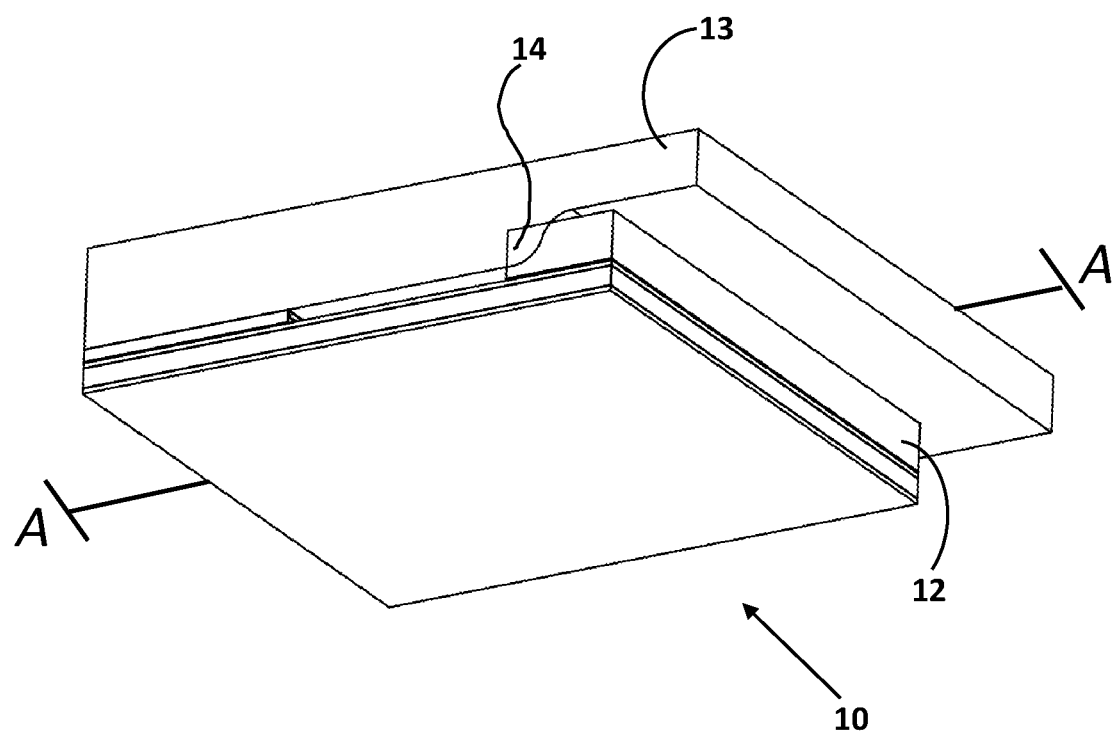
Figure 1C:
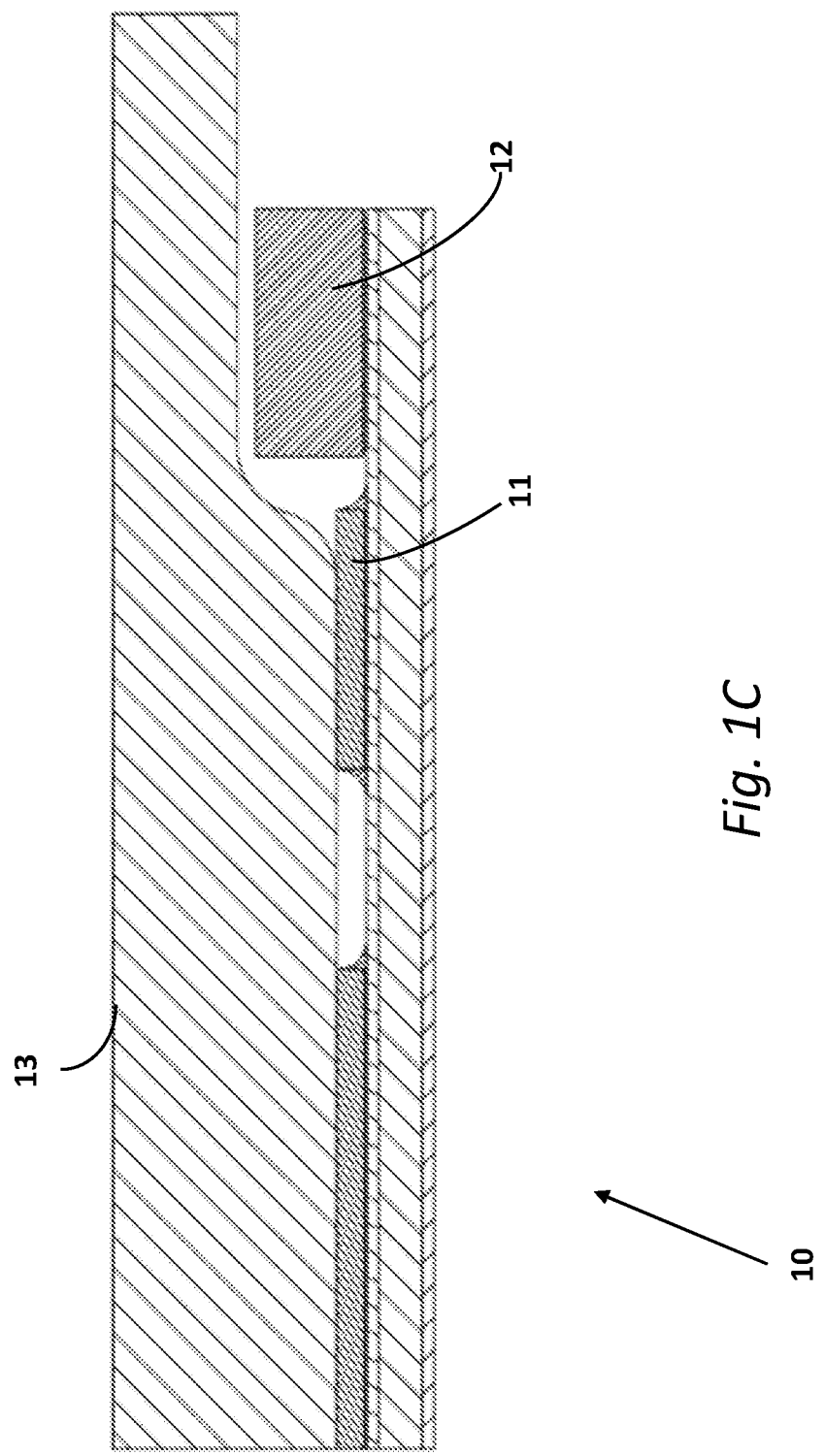

| Design | Maximal warpage amplitude at 30° C. |
|---|---|
| FIG. 1 - Full ring design (does not allow access to peripheral dies) | 116 μm |
| FIG. 2 - Narrow ring design | 163 μm |
| FIG. 3 - Lower than Silicon ring design | 187 μm |
| FIG. 4 - Stepped ring design | 122 μm |

All the above description has been provided for the purpose of illustration and is not intended to limit the invention in any way, except as provided for in the appended claims. For instance, stepped rings according to the invention can have different cross-sections and can be used in a variety of ASIC packages comprising different numbers of silicon dies and/or silicon dies that are differently located, all without exceeding the scope of the invention.

The invention claimed is:

1. A stiffener ring for an application specific integrated circuit (ASIC) package that includes a peripheral silicon die supported thereon, the stiffener ring comprising:
    a body having a non-uniform cross-section, the body defining:
        a first section having a height that is greater than a height of the peripheral silicon die of the ASIC package; and
        a second section having a height that is smaller than or equal to the height of the peripheral silicon die of the ASIC package,
        wherein the stiffener ring is configured to improve a stiffness associated with the ASIC package without impeding an attachment between a heat sink and the ASIC Package.

2. The stiffener ring according to claim 1, wherein the first section comprises a chamfered portion.

3. The stiffener ring according to claim 2, wherein the chamfered portion is formed with an angle other than 45° with respect to the second section.

4. The stiffener ring according to claim 1, wherein the second section is positioned closer to the peripheral silicon die than the first section.

5. The stiffener ring according to claim 1, wherein the first section and the second section are formed as an integral body.

6. The stiffener ring according to claim 1, wherein the first section and the second section are formed from a single piece of material.

7. The stiffener ring according to claim 1, wherein the stiffener ring is configured to be positioned along a peripheral edge of the ASIC package.

8. The stiffener ring according to claim 1, wherein the height of the first section increases as a distance between the first section and the peripheral silicon die increases.

9. The stiffener ring according to claim 1, wherein a cross-sectional shape of the first section varies as a distance between the first section and the peripheral silicon die increases.

10. The stiffener ring according to claim 1, wherein the second section is configured to allow contact between the heat sink attached to the ASIC package and the peripheral silicon die.

11. An application specific integrated circuit (ASIC) package comprising:
    a substrate;
    a peripheral silicon die supported by the substrate; and
    a stiffener ring attached to the substrate, the stiffener ring comprising:
        a body having a non-uniform cross-section, the body defining:
            a first section having a height that is greater than a height of the peripheral silicon die of the ASIC package; and
            a second section having a height that is smaller than or equal to the height of the peripheral silicon die of the ASIC package,
            wherein the stiffener ring is configured to improve a stiffness associated with the ASIC package.

12. The ASIC package according to claim 11, wherein the first section comprises a chamfered portion.

13. The ASIC package according to claim 12, wherein the chamfered portion is formed with an angle other than 45° with respect to the second section.

14. The ASIC package according to claim 11, wherein the second section is positioned closer to the peripheral silicon die than the first section.

15. The ASIC package according to claim 11, wherein the first section and the second section are formed as an integral body.

16. The ASIC package according to claim 11, wherein the first section and the second section are formed from a single piece of material.

17. The ASIC package according to claim 11, wherein the stiffener ring is positioned along a peripheral edge of the ASIC package.

18. The ASIC package according to claim 11, wherein the height of the first section increases as a distance between the first section and the peripheral silicon die increases.

19. The ASIC package according to claim 11, wherein a cross-sectional shape of the first section varies as a distance between the first section and the peripheral silicon die increases.

20. The ASIC package according to claim 11, further comprising a heat sink removably attached to the ASIC package, wherein the second section is configured to allow contact between the heat sink and the peripheral silicon die.

\* \* \* \* \*